United States Patent
van der Cammen

(10) Patent No.: US 11,329,607 B2
(45) Date of Patent: May 10, 2022

(54) RC OSCILLATOR

(71) Applicant: Catena Holding B.V., Delft (NL)

(72) Inventor: Peter van der Cammen, Delft (NL)

(73) Assignee: CATENA HOLDING B.V., Delft (NL)

(*) Notice: Subject to any disclaimer, the term of this patent is extended or adjusted under 35 U.S.C. 154(b) by 0 days.

(21) Appl. No.: 17/062,904

(22) Filed: Oct. 5, 2020

(65) Prior Publication Data

US 2021/0111673 A1 Apr. 15, 2021

(30) Foreign Application Priority Data

Oct. 11, 2019 (EP) .................................... 19202634

(51) Int. Cl.
| | | |
|---|---|---|
| *H03B 5/24* | (2006.01) | |
| *H03K 5/24* | (2006.01) | |
| *H03M 1/12* | (2006.01) | |

(52) U.S. Cl.
CPC ............... *H03B 5/24* (2013.01); *H03K 5/24* (2013.01); *H03M 1/12* (2013.01)

(58) Field of Classification Search
CPC ............................................. H03B 5/24
USPC .................................................. 331/111
See application file for complete search history.

(56) References Cited

U.S. PATENT DOCUMENTS

| | | | | |
|---|---|---|---|---|
| 5,565,819 A | * | 10/1996 | Cooper ................ | H03K 3/011 331/111 |
| 5,670,915 A | * | 9/1997 | Cooper ................ | H03K 3/0231 331/111 |
| 2008/0143671 A1 | | 6/2008 | Li | |
| 2012/0319789 A1 | | 12/2012 | Bhowmik et al. | |
| 2016/0056763 A1 | * | 2/2016 | Zhao .................... | H03B 5/24 331/111 |

FOREIGN PATENT DOCUMENTS

CN 204258726 U 4/2015

OTHER PUBLICATIONS

Gomes, Ruben et al.; "On-Chip Digital Temperature Sensor for CMOS Sensor"; International Conference on Biomedical Engineering and Applications; 4 pages (2018).

* cited by examiner

*Primary Examiner* — Joseph Chang

(57) ABSTRACT

The disclosure relates to a square wave RC oscillator circuit, example embodiments of which include an oscillator circuit for generating an output square wave signal (OUT) having first and second voltage output levels (L, H), the oscillator circuit comprising: a comparator having an output and first and second inputs; a switching circuit configured to provide an oscillatory waveform at the first input of the comparator; and a feedback circuit arranged to sample the first input of the comparator each time the output square wave signal (OUT) switches between the first and second voltage output levels (L, H) and to compare this sampled voltage with first and second reference voltages ($V_A$, $V_B$) to adjust a voltage provided to the second input of the comparator.

13 Claims, 7 Drawing Sheets

RC OSCILLATOR

CROSS-REFERENCE TO RELATED APPLICATIONS

This application claims the priority under 35 U.S.C. § 119 of European patent application no. 19202634.2, filed Oct. 11, 2019 the contents of which are incorporated by reference herein.

FIELD

The disclosure relates to a square wave oscillator circuit.

BACKGROUND

RC square wave oscillators are simple circuits that generate a square wave signal, which may for example be used as a clock signal. The frequency of the signal depends on the values of the resistor (R) and capacitor (C) in the oscillator. For integrated circuits (ICs) such oscillators have limited use because the absolute accuracy of an RC product is generally poor, resulting in an output frequency that is very unpredictable, with an accuracy of perhaps 20% or worse.

Although absolute values for resistors and capacitors in IC processing can be inaccurate, repeatability can be high. Matching between resistors and capacitors in ICs can therefore be more accurate. In various situations there may be a requirement for a signal, such as a clock signal, with a time period that is accurately related to an RC product, where the R and C values are component values within the same IC.

FIG. 1 shows the principle of operation of a conventional square wave RC oscillator 100. A capacitor $C_{OSC}$ is alternately charged and discharged with a current $V_{AB}/R_{OSC}$, which is controlled by the generated clock signal. The output clock signal 101 (see also FIG. 2) has two phases H and L, which control the switches 102, 103, 104. This results in a triangular waveform 104 (see also FIG. 2) across the capacitor $C_{OSC}$ with a nominal peak to peak amplitude $V_{AB}$ and an output frequency of $1/2R_{OSC}C_{OSC}$. Here, $V_{AB}=V_A-V_B$, where $V_A$ and $V_B$ are the voltages at which the comparator 105 switches.

The clock period of the square wave signal 101, $T_{CLK}=2C_{OSC}V_{AB}/I_{CH}$, where $I_{CH}$ is the charge/discharge current, determined by $V_{AB}/R_{OSC}$. The clock period $T_{CLK}$ is therefore equal to $2R_{OSC}C_{OSC}$.

There are several sources of error in implementing a square wave oscillator of the type described above. Firstly, if the switching frequency is high and the charge/discharge currents small, the value of the capacitor $C_{OSC}$ will need to be small, resulting in a small $V_{AB}$. If, for example, the clock frequency is of the order of 10 MHz ($T_{CLK}=100$ ns), the charge/discharge current will be 5 µA and the capacitor $C_{OSC}$ will be 5 pF, resulting in $V_{AB}$ being 50 mV. The voltage $V_{AB}$ can be increased when decreasing $C_{OSC}$, but this will result in parasitic capacitances becoming more significant. Increasing the charge/discharge current may also be possible, but higher currents can be problematic in IC design.

A second problem relates to inaccurate switching levels caused by time delays if $V_{AB}$ is small (e.g. 50 mV). The comparator 105 switches when $V_{IN}>V_A$ in charge mode or when $V_{IN}<V_B$ in discharge mode. However, an excess differential input voltage is required to cause the comparator 105 output to switch between states. This excess voltage is effectively added to $V_{AB}$ in determining the clock frequency. To keep this error small, the gain of the comparator 105 can be made high, which requires multiple amplifier stages. This will, however, introduce a larger error caused by a time delay between the moment the input voltage $V_{IN}$ passes the switching level and the moment the circuit changes between charging and discharging. Due to this, the actual switching levels, shown as $V_{HIGH}$ and $V_{LOW}$ in FIG. 3 are not the same as the designated switching levels $V_A$ and $V_B$. Time delays $t_{da}$ and $t_{db}$ are added to the period $T_{CLK}$. In addition, the amplitude of the triangular waveform 104 is increased, resulting in a longer charge/discharge time. These effects may result in more than a 10% increase in the resulting oscillator period time.

A third problem relates to inaccurate switching levels caused by offsets. The oscillator circuit of FIG. 1 has only one comparator 105. Any offset voltage at the input will not affect the output frequency. If the high level switching occurs at $V_A+V_{OFFSET}$, then the low level switching will occur at $V_B+V_{OFFSET}$. The difference then remains $V_A-V_B=V_{AB}$. There are however many implementations that make use of two comparators, one for the high level $V_A$ and one for the low level $V_B$. This solves many other problems like not having to switch between $V_A$ and $V_B$ all the time at the (sensitive) input of the comparator. In the case of two comparators however, the input offset of the comparators does affect the accuracy of the output frequency.

The above mentioned errors all result in deviations from the actual switching levels $V_{HIGH}$ and $V_{LOW}$ with the intended switching levels $V_A$ and $V_B$. Other sources of errors can affect the slope of the triangular waveform at the capacitor $C_{OSC}$. A fourth problem relates to inaccuracy in the charge/discharge slope caused by parasitic capacitances. As mentioned above, all components that are connected to the capacitor $C_{OSC}$ have parasitic capacitances by themselves, which will add to the value $C_{OSC}$ in the formula for the output clock period. If, for instance the designer had a reason to choose for a two comparator solution (often the case) the input offset voltages would be kept small by increasing the size of the comparator input transistors. These larger transistors would however have larger input capacitances that would affect the accuracy of the charge/discharge slope. For the accuracy of the slope, the input transistors should be small, thereby introducing more offset voltage.

A fifth problem relates to inaccuracy in the charge/discharge slope caused by inaccuracy in the charge and discharge current. This is a general problem that can be solved with good engineering practice such as by cascoding and other techniques.

Finally, a sixth problem relates to inaccuracy caused by charge injection. Each time a (MOS-transistor) switch closes or opens, some charge is injected or withdrawn from the nodes it is connected to. This will result in a voltage step 401 at each switching point, as shown in FIG. 4, which results in a deviation from an ideal triangular waveform. If an NMOS switch is closed, this is done by lifting the voltage at its gate, so charge will be injected at the source and drain nodes. When it is opened, the gate voltage is pulled low and charge is withdrawn from these nodes. For PMOS-switches it is the other way around. Charge injection can be compensated by the use of dummy switches connected at the same nodes. The switches at the comparator reference input that are needed in case of a 'one comparator oscillator' can cause a lot of harm at this sensitive (high_Z) node. As explained, this is the reason that often two comparators are used, resulting in the earlier mentioned offset problem.

Conventional solutions to the above mentioned problems that result in a deviation from the intended slope and the effects of charge injection include good engineering practices like cascoding current sources, using dummy switches for compensation of charge injection and using two comparators with larger input transistors to reduce offset.

A conventional solution to problems that result in a deviation from the triangle amplitude (for example in terms of offset and time delay) is trimming, i.e. making some components adjustable in order to adjust the output frequency later in the application. Trimming is, however, suboptimal and cannot correct for deviations caused by temperature, supply voltage variation, aging and, when trimming is performed in the same way for an entire batch, deviation between different specimens.

SUMMARY

In accordance with the present disclosure, there is provided a circuit for generating a square wave signal having first and second voltage output levels, the circuit comprising:
- a comparator having an output and first and second inputs;
- a switching circuit configured to provide an oscillatory waveform at the first input of the comparator; and
- a feedback circuit arranged to sample the first input of the comparator each time the output square wave signal switches between the first and second voltage output levels and to compare this sampled voltage with first and second reference voltages to adjust a voltage provided to the second input of the comparator.

In some examples, the switching circuit may comprise:
- a first capacitor connected between the first input of the comparator and a common connection;
- a first switch connected between the first input of the comparator and a first current source, the first switch configured to connect the first current source to charge the first capacitor when the output square wave signal is at the first voltage level; and
- a second switch connected between the first input of the comparator and a second current source, the second switch configured to connect the second current source to discharge the capacitor when the output square wave signal is at the second voltage level.

The feedback circuit may comprise:
- a sampler having an input connected to the output of the comparator and configured to provide a first sampling pulse when the output of the comparator changes from the first voltage level to the second voltage level and a second sampling pulse when the voltage at the output of the comparator changes from the second voltage level to the first voltage level;
- a first amplifier having a first input connected to the first input of the comparator via a third switch configured to close upon receiving the first sampling pulse from the sampler and a second input connected to a first reference voltage source;
- a second capacitor connected between the first input of the first amplifier and the common connection;
- a second amplifier having a first input connected to the first input of the comparator via a fourth switch configured to close upon receiving the second sampling pulse from the sampler and a second input connected to a second reference voltage source;
- a third capacitor connected between the first input of the second amplifier and the common connection; and
- a fifth switch connected between the second input of the comparator and outputs of the first and second amplifiers, the fifth switch configured to alternately connect the second input of the comparator to the output of the first amplifier and the output of the second amplifier.

In some examples, the fifth switch may be configured to connect the second input of the comparator to the output of the first amplifier when the output of the comparator is at the first voltage level and to the output of the second amplifier when the output of the comparator is at the second voltage level. In alternative examples, the fifth switch may be configured to connect the second input of the comparator to the output of the first amplifier when the output square wave signal is at the first voltage level and to the output of the second amplifier when the output square wave signal is at the second voltage level.

The outputs of the first and second amplifiers may be connected to the fifth switch via respective first and second low pass filters. The low pass filters serve to remove switching spikes from the signals provided to the fifth switch.

In some examples the RC oscillator circuit may be configured to provide a triangular waveform to the first input of the comparator, i.e. where the charge and discharge rates of the first capacitor are equal and opposite. In alternative examples the RC oscillator circuit may be configured to provide a different waveform where the charge and discharge rates are different and the resulting waveform is asymmetric. Any oscillatory waveform where the peak to peak amplitude determines the output period may alternatively be applied as an input waveform to the comparator.

The first and second current sources may be configured to provide a current having a magnitude equal to a difference between the first and second reference voltages divided by a first resistor.

The amplitude of the waveform provided as an input to the comparator is accurately fixed by negative feedback provided by sampling the input when the output changes. At the moment the comparator output changes between high and low, a sample is taken from the waveform signal. These samples are compared with the intended peak values, defined by the reference voltage levels, and the comparator switching levels are adjusted by a feedback loop to make the measured amplitude the same as the intended amplitude. The circuit therefore addresses the problems outlined above, in particular those relating to errors that affect the amplitude of the input waveform.

The oscillator circuit may be incorporated into an integrated circuit that comprises an analog to digital converter configured to output a digital value corresponding to a ratio between a first input voltage and a second input voltage, wherein the output square wave signal of the oscillator circuit is provided as a clock signal to the analog to digital converter. The first input voltage may be a reference voltage and the second input voltage may be temperature dependent, such that the output digital value of the analog to digital converter corresponds to a temperature.

These and other aspects of the invention will be apparent from, and elucidated with reference to, the embodiments described hereinafter.

BRIEF DESCRIPTION OF DRAWINGS

Embodiments will be described, by way of example only, with reference to the drawings, in which.

Figure 1:
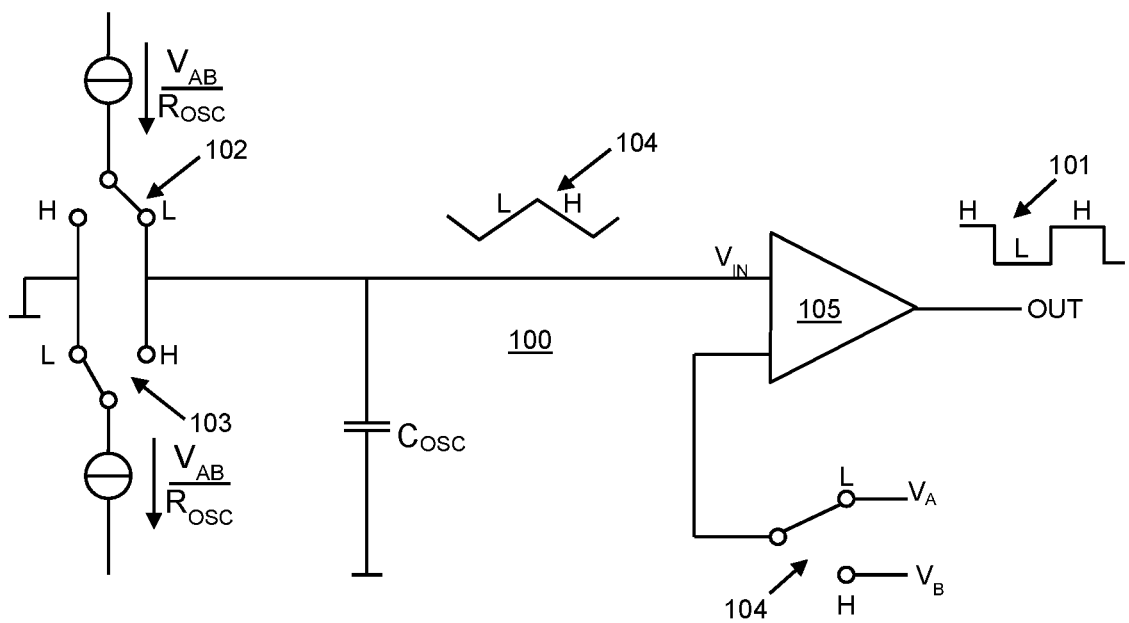
FIG. 1 is a schematic diagram of a conventional square wave oscillator circuit.
Figure 2:
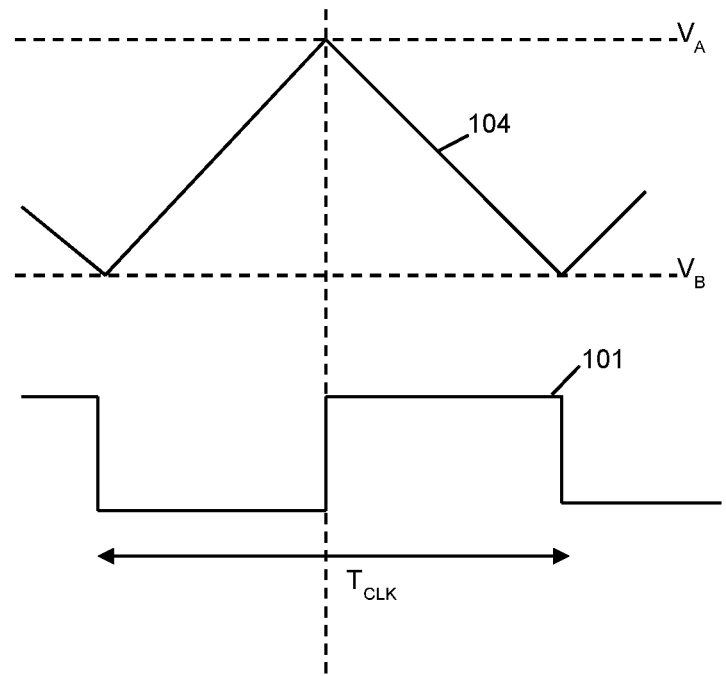
FIG. 2 is a schematic diagram of triangular and square waveforms from the circuit of FIG. 1.
Figure 3:
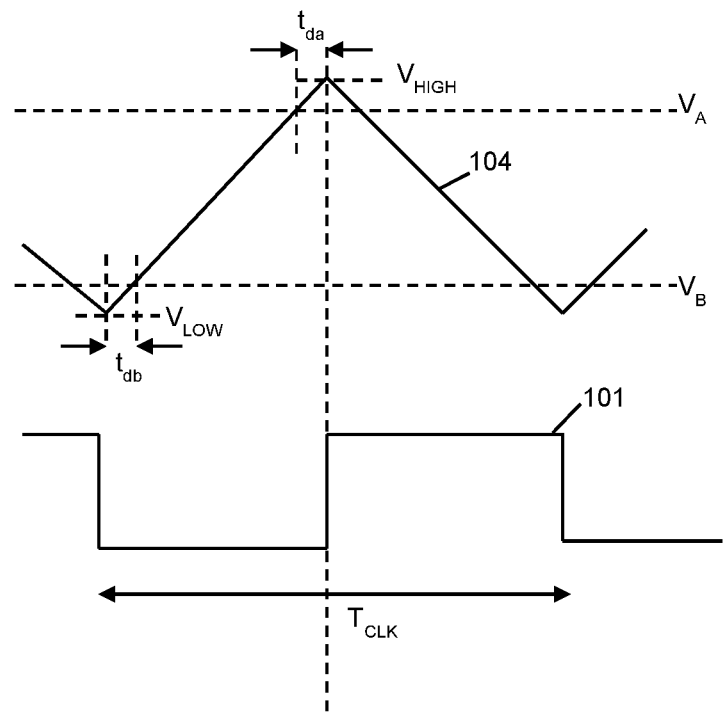
FIG. 3 is a schematic diagram of triangular and square waveforms with inaccurate switching levels caused by time delays.
Figure 4:
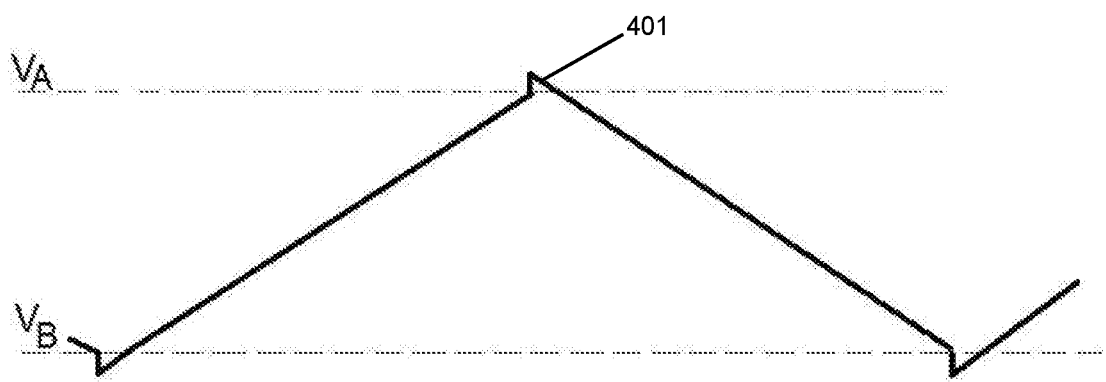
FIG. 4 is a schematic diagram of a triangular waveform having step changes caused by charge injection.

It should be noted that the Figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar features in modified and different embodiments.

DETAILED DESCRIPTION OF EMBODIMENTS

FIGS. 1 to 4 have been described above in relation to the background.

Figure 5:
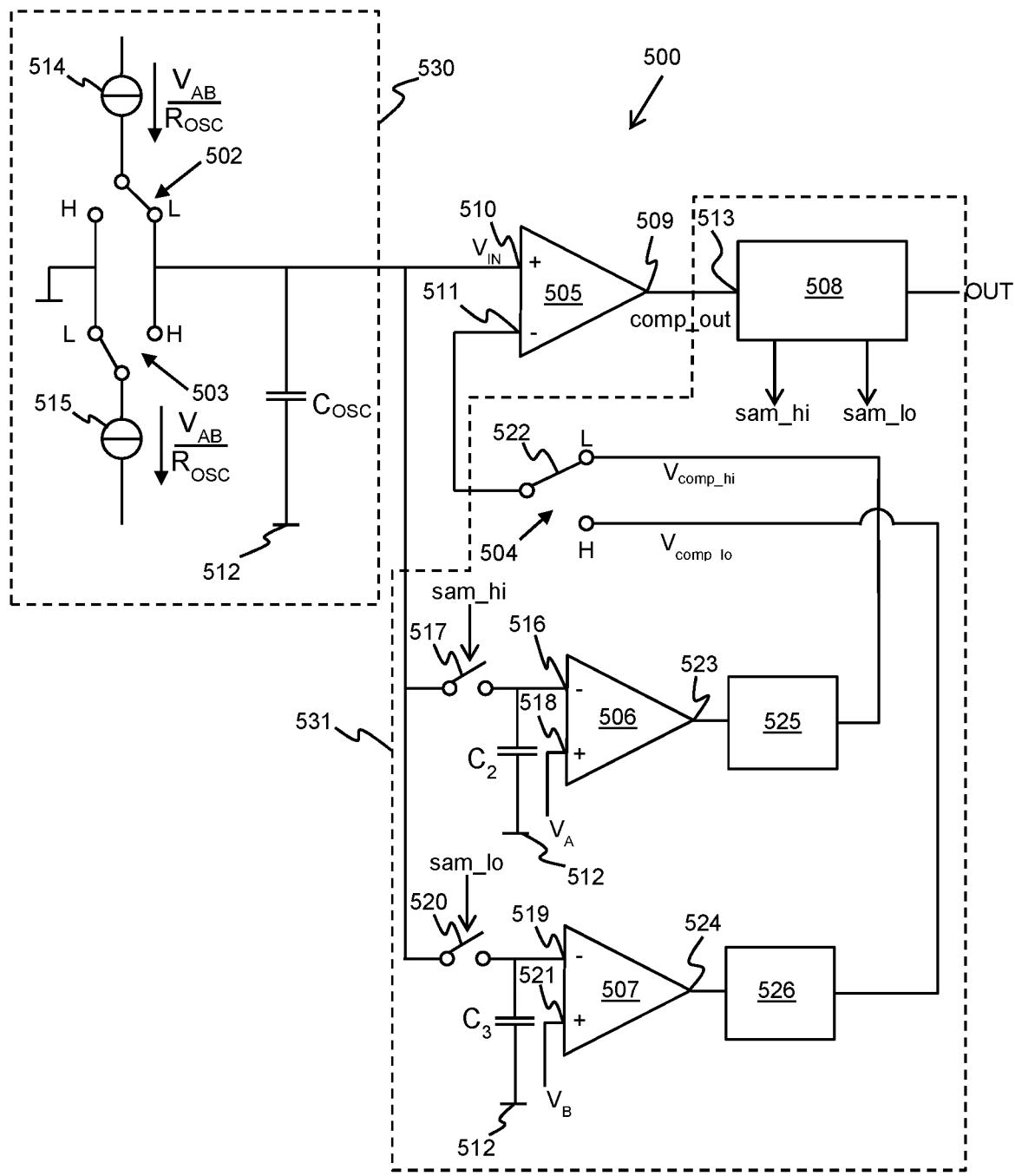
FIG. 5 is a schematic diagram of an example square wave oscillator circuit.

FIG. 5 is a schematic diagram of an example square wave oscillator circuit 500 that aims to address one or more of the problems outlined above relating to accuracy of providing a square wave output signal. The circuit 500 comprises an RC oscillator switching circuit 530 similar to that of the conventional oscillator circuit 100 of FIG. 1, and with a comparator 505 similar to the comparator 105 of FIG. 1. The RC oscillator circuit 530 comprises a capacitor $C_{OSC}$ connected between a switching circuit and a common connection 512. The switching circuit comprises a pair of current sources 514, 515 switchably connected to the capacitor $C_{OSC}$, the switching being controlled by the high and low voltage levels of the output signal OUT from the circuit 500. When the output signal is low, switch 502 connects current source 514 to capacitor $C_{OSC}$ and when the output signal is high, switch 515 connects current source 515 to capacitor $C_{OSC}$. Each current source provides a current to capacitor $C_{OSC}$ that is determined by the difference between reference voltage levels $V_A$ and $V_B$, termed $V_{AB}$, and by the resistor component $R_{OSC}$ of the RC oscillator circuit 530. When switch 502 connects current source 514 to capacitor $C_{OSC}$, the voltage across $C_{OSC}$ increases at a constant rate, and when switch 515 connects current source 515 to capacitor $C_{OSC}$, the voltage across $C_{OSC}$ decreases at the same constant rate. The voltage across the capacitor $C_{OSC}$ is provided at a non-inverting input 510 of a comparator 505 as a triangular wave voltage signal $V_{IN}$.

As with the comparator 105 of FIG. 1, the comparator 505 is configured to compare the triangular waveform provided at the first input 510 with a voltage provided to a second input 511, in this case the inverting input of the comparator 505. The voltage provided at the second input 511 is switched by switch 522 each time the output 509 of the comparator switches between a high and low state. In this case, however, the comparison is made with a voltage that is adjusted by a feedback circuit 531 that is arranged to sample the voltage $V_{IN}$ at the first input 510 each time the output 509 switches between high and low states and compare this sampled voltage with first and second reference voltages $V_A$, $V_B$, which are the intended peak values of the triangular waveform provided to the input 510, to adjust a voltage provided to the second input 511 of the comparator 505.

In the arrangement shown in FIG. 5, switch 522 is controlled by the output comp_out of the comparator 505. In alternative arrangements, switch 522 may instead be controlled by the square wave output OUT, i.e. the output from the sampler 508.

Figure 6:
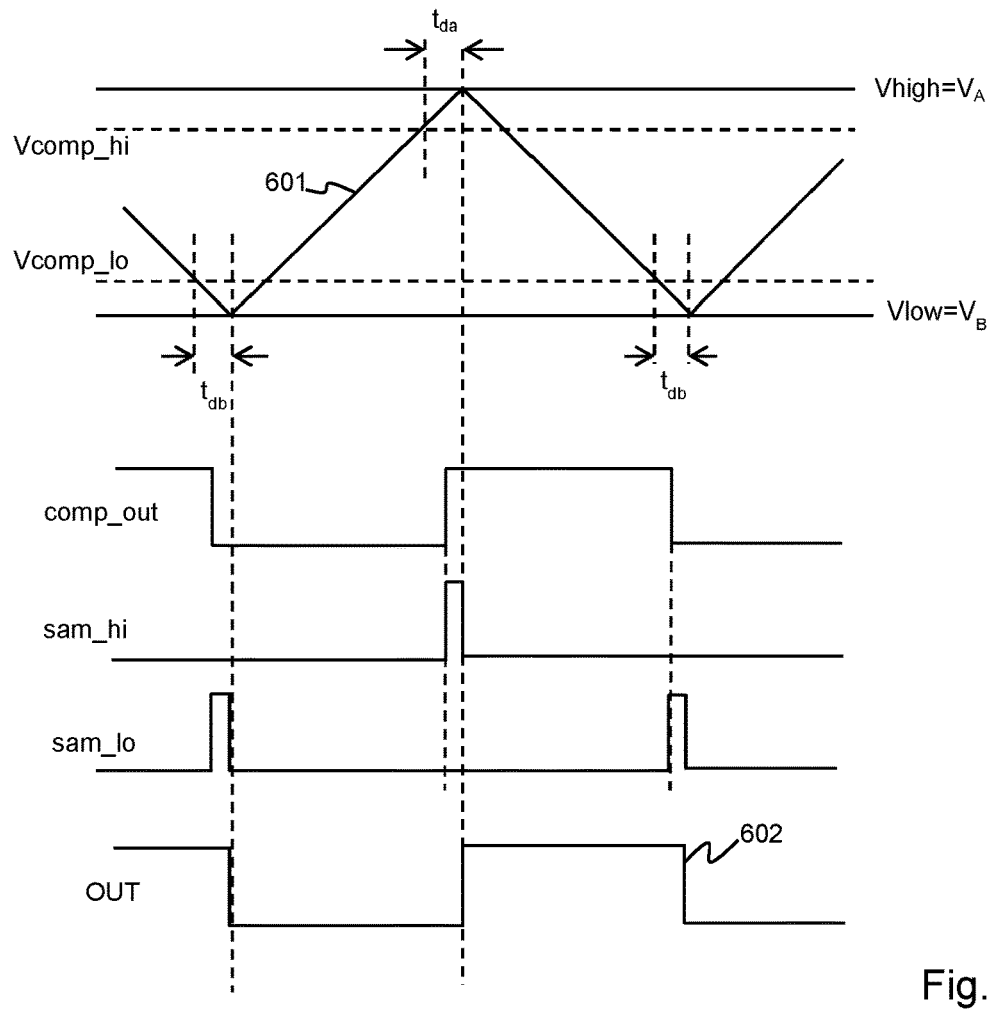
FIG. 6 is a schematic diagram of various waveforms from the oscillator circuit of FIG. 5.

The feedback circuit 531 comprises a sampler 508, which is connected to the output 509 of the comparator and provides sample pulses sam_hi and sam_lo from the output voltage signal comp_out of the comparator 505. The signals comp_out, sam_hi and sam_lo, along with the input triangular waveform $V_{IN}$ 601 and output square wave OUT 602, are illustrated in FIG. 6.

Sample pulse sam_hi goes from low to high when the output comp_out of the comparator 505 goes from low to high. When sam_hi goes low again the output OUT goes from high to low. Conversely, sample pulse sam_lo goes from low to high when comp_out goes from high to low. When sam_lo goes low again, OUT goes from high to low. The effect of this is that a sample is taken each time the output switches state, and this is used to control the voltage level the input signal $V_{IN}$ is compared with.

Sample switches 517 or 520 are closed for a the short time interval that sample pulses sam_hi or sam_lo are high. When sample switches 517, 520 open again, the output signal OUT changes state.

Charge/discharge switches 502 and 503 are controlled by the output signal OUT after the samples are taken, but switch 522 can be switched by the output of the comparator 505 comp_out instead of the output signal OUT. For practical reasons, this is preferable because a possible delay of switch 522 is less critical and the spikes that are caused by the switching of switch 522 will not affect the switching of switches 502/503 or the charge/discharge cycles. Therefore, switch 522 can be controlled by either comp_out or OUT, while switches 502 and 503 must be controlled by OUT.

Operation of switch 522 does not affect the comp_out state: when the voltage at the inverting input 511 of comparator 505 is connected via switch 522 to Vcomp_lo and $V_{IN}$ drops below Vcomp_lo, then comp_out goes low. As a result, 522 switches and Vcomp_hi is connected to the inverting input 511. This results in positive feedback: the voltage at node 511 is suddenly way below the voltage $V_{IN}$ at node 510, which will help the comparator 505 switch faster.

First and second amplifiers 506, 507 each have a first input 516, 519 that is switchably connected to the first input 510 of the comparator 505 via respective switches 517, 520. Switch 517 closes upon receiving the sample pulse sam_hi, while switch 520 closes upon receiving the sample pulse sam_lo. A second input 518, 521 of each amplifier is connected to respective reference voltage sources $V_A$, $V_B$. The first input 516, 519 of each amplifier 506, 507 is connected to the common connection 512 via respective capacitors $C_2$, $C_3$. An output 523, 524 of each amplifier 506, 507 is connected to switch 522 via an optional low pass filter 525, 526.

The timing of the sampler 508 means that sample pulses sam_hi and sam_lo are used to take a voltage sample from the triangular waveform provided at the comparator input 510 at its high and low peaks, resulting in samples Vhigh and Vlow respectively (see FIG. 6). A first amplifier 506 amplifies the difference between Vhigh and a first reference voltage $V_A$, and the output from the amplifier 506 is fed to optional low pass filter 525 to provide a signal Vcomp_hi that is connected to the comparator second input 511 during the low phase of the comparator output signal comp_out. Amplifier 507 amplifies the difference between Vlow and a second reference voltage $V_B$, and the output from amplifier 507 is fed to optional low pass filter 526 that is connected to the comparator second input 511 during the high phase of the output signal. The effect of this is that, once the feedback loop is settled, the peak to peak amplitude of the triangular waveform 601 becomes identical to the intended difference between the first and second reference voltages, i.e. $V_A - V_B = V_{AB}$.

Input offset voltages of the amplifiers 506, 507 may cause an error on the amplitude of the triangular waveform 601. These errors can however be made small because the size of the input transistors of the amplifiers 506, 507 can be chosen to be larger without resulting in a system performance penalty.

Figure 7:
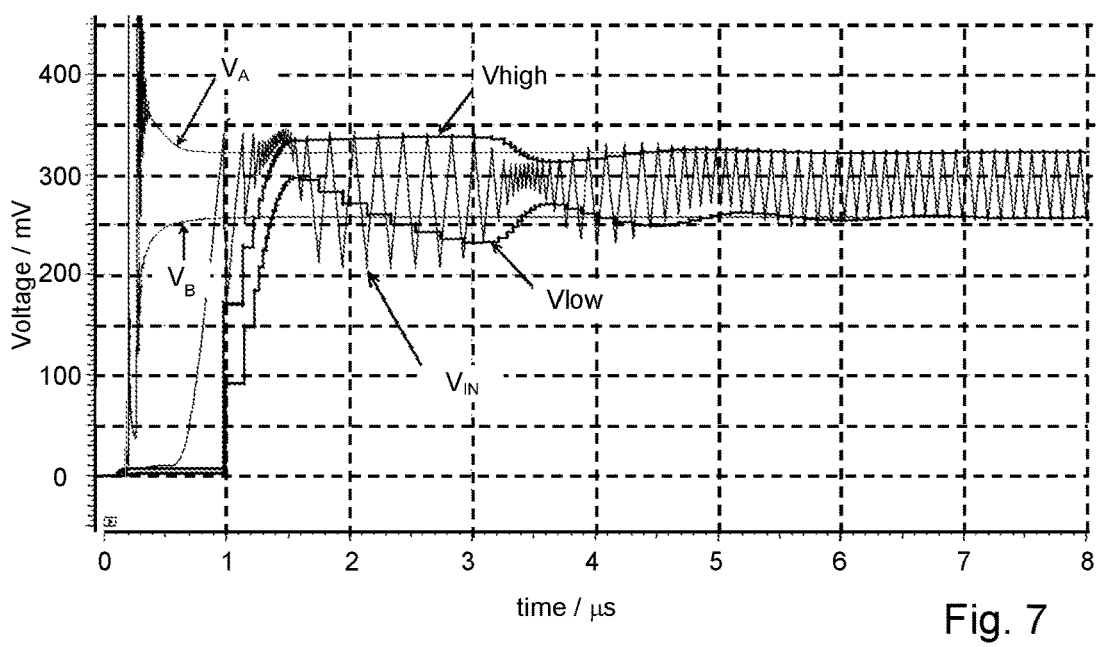
FIG. 7 is a plot of simulated voltages as a function of time for the circuit of FIG. 5.

FIG. 7 illustrates an example simulation plot of the expected behaviour of the circuit 500 of FIG. 5 in terms of the reference voltages $V_A$, $V_B$, the signal $V_{IN}$ (i.e. the input triangular waveform) and signals Vhigh and Vlow. Once the reference voltage levels $V_A$, $V_B$ have stabilised, at around 1 μs, the oscillator circuit 530 begins to provide a triangular waveform $V_{IN}$ and the voltage signals Vhigh, Vlow are progressively adjusted by the feedback circuit 531. At around 4 μs the triangular waveform $V_{IN}$ begins to stabilise and by around 8 μs the output had fully stabilised such that Vhigh=$V_A$ and Vlow=$V_B$.

The waveform provided to the comparator in the examples above is in the form of a triangular waveform, i.e. with equal charge and discharge rates given by $V_{AB}/R_{OSC}$. In other examples a different shaped waveform may also be used, for example an asymmetrical type waveform, where the charge and discharge rates are unequal. Such alternative examples may for example involve the use of one capacitor that is charged at a constant rate and then reset to 0V, or by using two capacitors in one RC oscillator where a first capacitor is discharged to 0V while a second is charged to $V_A$, followed by toggling of the output and discharging the second capacitor to 0V while the first capacitor is charged to $V_A$. Other types of RC oscillator arrangements may also be possible. The common feature to all such RC oscillators with the square wave oscillator of the type disclosed herein is that the peak amplitude of the input voltage signal is sampled each time the output of the comparator switches, and this is compared with the intended value (i.e. $V_A$ or $V_B$) in a feedback loop that is used to adjust the value provided to the second input of the comparator to make the output square wave signal have an amplitude equal to the difference between the reference voltages.

Figure 8:
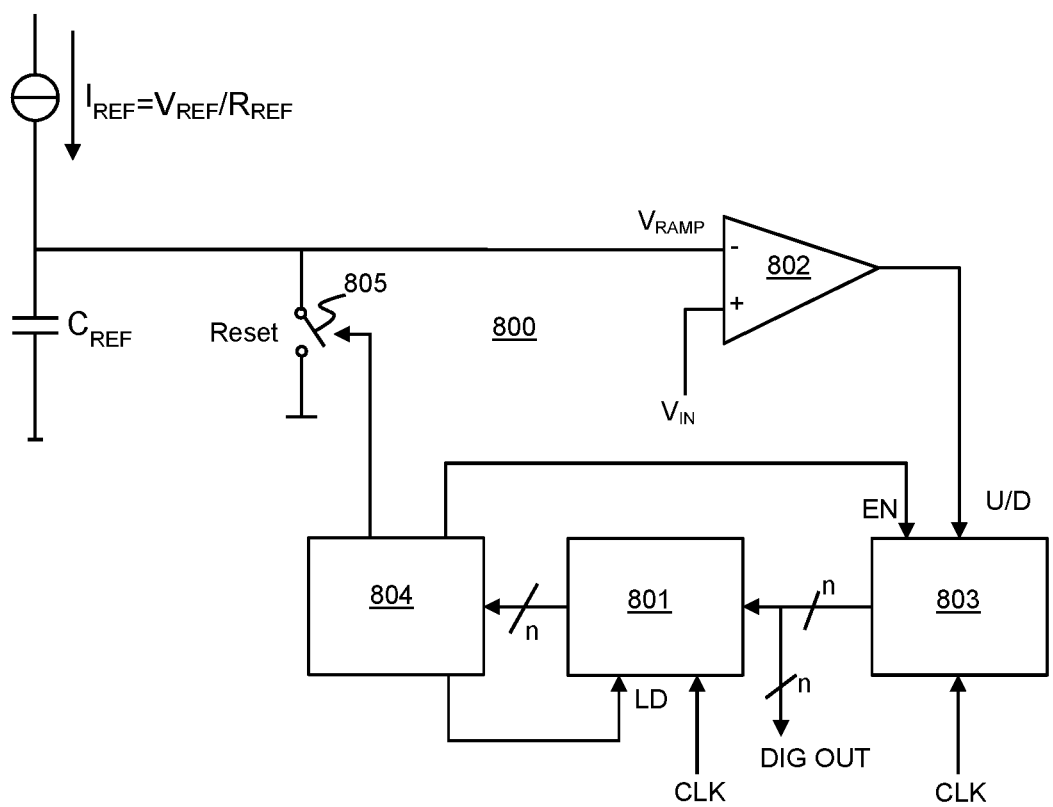
FIG. 8 is a schematic diagram of an example analog to digital converter (ADC) using a clock signal provided by the oscillator circuit of FIG. 5.
Figure 9:
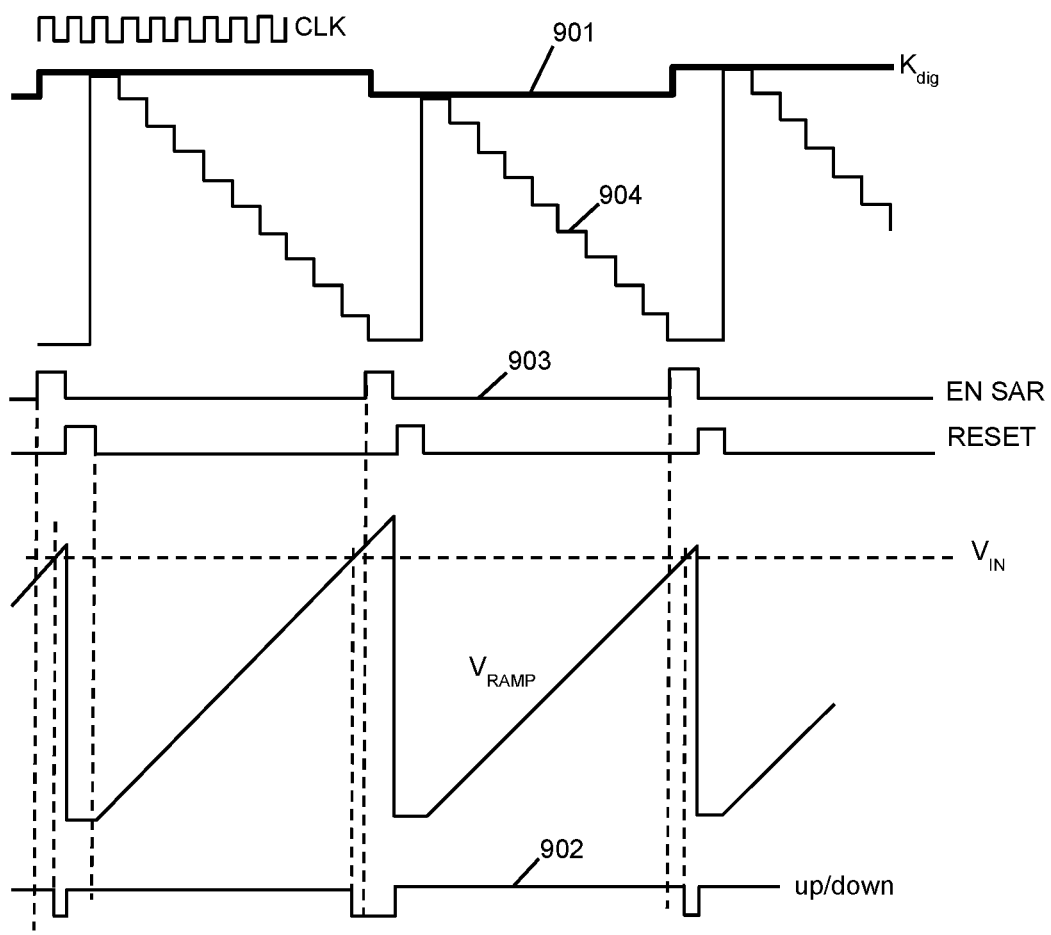
FIG. 9 is a schematic diagram of example voltage signals in the ADC of FIG. 8.

A square wave oscillator of the type disclosed herein may be used in applications where it is important that the period of a clock signal is accurately related to an RC product, where R and C are internal component values of the IC. A first example is an analog to digital converter (ADC) 800 with a counting DAC in a feedback path, an example of which is shown in FIG. 8. An example set of voltage signals in the ADC 800 is shown in FIG. 9. In this, the ratio between an input voltage $V_{IN}$ and a reference voltage $V_{REF}$ is expressed as an n-bit digital word. $V_{REF}$ is converted into a current $I_{REF} = V_{REF}/R_{REF}$, where $R_{REF}$ is an internal resistor in the IC. The n-bit digital output word $K_{dig}$ is stored in an n-bit counter 801, which counts down to zero in $K_{dig}T_{CLK}$ seconds. During that time, an internal capacitor $C_{REF}$ is charged with $I_{REF}$ to a voltage $V_{RAMP}$. $V_{RAMP}$ is compared with the analog input voltage $V_{IN}$ by comparator 802. The comparator output controls the up/down input of a successive approximation register (SAR) block 803. When the down counter contents 904 has counted down to zero, the SAR 803 will respond at its U/D input 902 by either increasing or decreasing its contents $K_{dig}$ and the new SAR contents 901 is loaded in the down counter 801. The capacitor $C_{REF}$ is discharged to 0V subsequently with a reset switch 805 activated by logic 804 that closes the reset switch.

When Vramp is below Vin, the up/down output 902 is high. At the upgoing edge of signal EN SAR 903, the SAR contents 901 is increased or decreased, depending on the sign of the up/down signal 902 at that moment.

The SAR 803 responds to its up/down input U/D in a way such that it finally iterates to its end value. This may be a simple up-down counter that increases or decreases by 1 each time it is enabled. When this feedback loop is settled the SAR contents 901 will toggle between two values. The contents $K_{dig}$ will then represent the ratio $V_{IN}/V_{REF}$. The peak value of $V_{RAMP}$ will be $V_{IN}$ in that case, i.e. $V_{IN} = V_{RAMP} = (I_{REF} \cdot K_{DIG} \cdot T_{CLK})/C_{REF}$. If $T_{CLK}$ is derived from an RC oscillator, it is possible to make $T_{CLK} = R_{OSC} \cdot C_{OSC}$, where $R_{OSC}$ and $C_{OSC}$ are the internal components of the IC as well. Further, with $I_{REF} = V_{REF}/R_{REF}$, we obtain:

$$V_{IN} = N_{REF} \cdot K_{dig} \cdot R_{OSC} \cdot C_{OSC}/R_{REF} \cdot C_{REF})$$

or:

$$K_{dig} = (V_{IN}/V_{REF}) \cdot \{(R_{REF} \cdot C_{REF})/(R_{OSC} \cdot C_{OSC})\} = k \cdot V_{IN}/V_{REF}$$

If $R_{REF}$, $C_{REF}$, $R_{OSC}$ and $C_{OSC}$ are all realized in the same IC, the ratio k can be made accurate due to the close matching of resistors and capacitors of the same type in the same IC. The clock period of the internal RC square wave oscillator as described herein can be made accurately proportional to an internal RC time and is therefore very suitable for this application.

In a second example, a temperature sensor may be based on an ADC with a counting DAC in a feedback path. In an IC, bandgap reference circuits are circuits that generate a fairly accurate (1-2%) temperature compensated reference voltage $V_{REF}$, based on the (extrapolated) bandgap voltage of a PN junction. A bandgap reference voltage is a voltage that is sum of a diode voltage $V_{diode}$ (with negative temperature coefficient) and a PTAT-voltage $V_{ptat}$ (positive temperature coefficient). PTAT stands for 'proportional to absolute temperature'. Such a voltage can be accurately obtained from the difference between two diode voltages with different current densities. The PTAT voltage can be amplified such that it has the same but opposite temperature dependency as the diode voltage temperature dependency. The ratio of $V_{ptat}$ and $V_{REF}$ can therefore be used for a temperature measurement. If, in the ADC circuit 800 shown in FIG. 8, the PTAT voltage $V_{ptat}$ is used as the input $V_{IN}$ and the bandgap reference voltage $V_{bg}$ as $V_{REF}$, a temperature sensor with a digital output reading is obtained, where a digital output of 0 corresponds to 0K. An offset may be implemented to select a different temperature to correspond to a digital output of 0.

Figure 10:
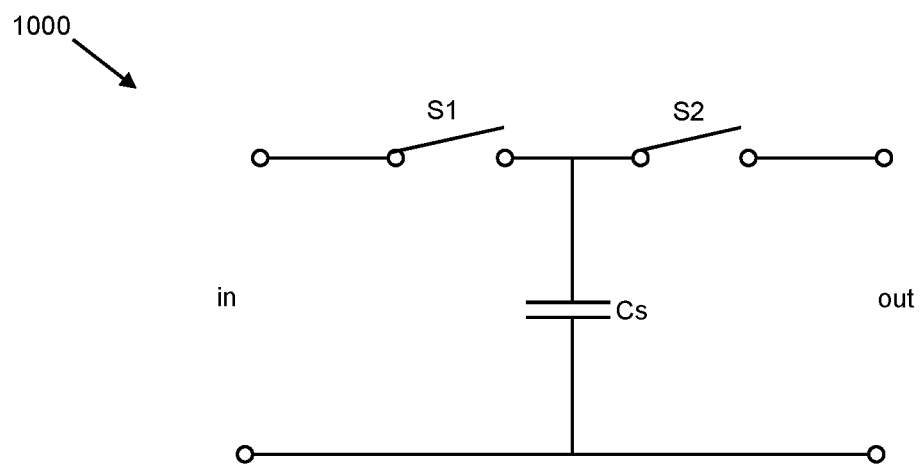
FIG. 10 is a schematic diagram of an example switched capacitor resistor circuit.

In a third example application, a switched capacitor resistor 1000, a schematic diagram of which is shown in FIG. 10, may be driven by the clock signal from the square wave oscillator circuit 500. In a first period of a clock cycle, a capacitor Cs is charged to an input voltage $V_{in}$ by closing switch S1 and opening switch S2 and then, during a second period of the clock cycle, the capacitor Cs discharged to an output voltage $V_t$ by opening switch S1 and closing switch S2. The amount of charge transferred from the input to the output is $Q=C_s \cdot (V_{in}-V_{out})$. If the clock frequency is $f_{CLK}$, the average current flowing from input to output is $I_{AV}=f_{CLK} \cdot C_s (V_{in}-V_{out})$. The equivalent resistor is then $R_{EQ}=(V_{in}-V_{out})/I_{AV}=1/(f_{CLK} \cdot C_s)$. If $f_{CLK}$ is derived from an accurate RC oscillator, $f_{CLK}=1/(R_{OSC} \cdot C_{OSC})$. The equivalent resistor is therefore $R_{EQ}=R_{OSC} \cdot C_{OSC}/C_s$, which is accurately proportional to $R_{OSC}$. $R_{EQ}$ can then be easily scaled by changing $C_s$ or scaling $f_{CLK}$ with dividers or rate multipliers. Switched capacitor resistors may for example be used in switched capacitor filters.

From reading the present disclosure, other variations and modifications will be apparent to the skilled person. Such variations and modifications may involve equivalent and other features which are already known in the art of electronic circuit design, and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable subcombination. The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, and reference signs in the claims shall not be construed as limiting the scope of the claims.

The invention claimed is:

1. An oscillator circuit configured to generate an output square wave signal having first and second voltage output levels, the oscillator circuit comprising:
   a single comparator having a single output and first and second inputs;
   a switching circuit configured to provide an oscillatory waveform at the first input of the comparator; and
   a feedback circuit configured
      to sample a voltage on the first input of the comparator in response to the output square wave signal switching between the first and second voltage output levels,
      to compare the voltage sample with first and second reference voltages, and
      to adjust a voltage provided to the second input of the comparator.

2. The oscillator circuit of claim 1 wherein the switching circuit comprises:
   a first capacitor connected between the first input of the comparator and a common connection;
   a first switch connected between the first input of the comparator and a first current source, the first switch configured to connect the first current source to charge the first capacitor when the output square wave signal is at the first voltage level;
   a second switch connected between the first input of the comparator and a second current source, the second switch configured to connect the second current source to discharge the capacitor when the output square wave signal is at the second voltage level.

3. The oscillator circuit of claim 1, wherein the feedback circuit comprises:
   a sampler having an input coupled to the output of the comparator and configured to provide
      a first sampling pulse in response to the output of the comparator changing from the first voltage level to the second voltage level and
      a second sampling pulse in response to the voltage at the output of the comparator changing from the second voltage level to the first voltage level;
   a first amplifier having a first input coupled to the first input of the comparator via a third switch configured to close upon receiving the first sampling pulse from the sampler and a second input coupled to a first reference voltage source;
   a second capacitor coupled between the first input of the first amplifier and the common connection;
   a second amplifier having a first input connected to the first input of the comparator via a fourth switch configured to close upon receiving the second sampling pulse from the sampler and a second input coupled to a second reference voltage source;
   a third capacitor coupled between the first input of the second amplifier and the common connection; and
   a fifth switch coupled between the second input of the comparator and outputs of the first and second amplifiers,
   the fifth switch configured to alternately connect the second input of the comparator to the output of the first amplifier and the output of the second amplifier.

4. The oscillator circuit of claim 3 wherein the fifth switch is configured
   to connect the second input of the comparator to the output of the first amplifier when the output of the comparator is at the first voltage level and
   to the output of the second amplifier when the output of the comparator is at the second voltage level.

5. The oscillator circuit of claim 3 wherein the fifth switch is configured
   to connect the second input of the comparator to the output of the first amplifier when the output square wave signal is at the first voltage level and
   to the output of the second amplifier when the output square wave signal is at the second voltage level.

6. The oscillator circuit of claim 3:
wherein the outputs of the first and second amplifiers are coupled to the fifth switch via respective first and second low pass filters.

7. The oscillator circuit of claim 1 wherein the switching circuit is configured to provide a triangular waveform to the first input of the comparator.

8. The oscillator circuit of claim 2:
wherein the first and second current sources are each configured to provide a current having a magnitude equal to a difference between the first and second reference voltages divided by a first resistor (ROSC).

9. The oscillator circuit of claim 1:
wherein the oscillator circuit is embedded in an integrated circuit; and
wherein the integrated circuit includes an analog to digital converter configured to output a digital value corresponding to a ratio between a first input voltage and a second input voltage, wherein the output square wave signal of the oscillator circuit is provided as a clock signal to the analog to digital converter.

10. The oscillator circuit of claim 9,
wherein the first input voltage is a reference voltage and the second input voltage is temperature dependent, such that the output digital value of the analog to digital converter corresponds to a temperature.

11. The oscillator circuit of claim 1:
wherein the oscillator circuit is embedded in an integrated circuit; and
wherein the integrated circuit includes a switched capacitor resistor circuit,
wherein the output square wave signal of the oscillator circuit is provided as a switching signal to the switched capacitor resistor circuit.

12. An oscillator circuit configured to generate an output square wave signal having first and second voltage output levels, the oscillator circuit comprising:
a comparator having an output and first and second inputs;
a switching circuit configured to provide an oscillatory waveform at the first input of the comparator; and
a feedback circuit configured
to sample a voltage on the first input of the comparator in response to the output square wave signal switching between the first and second voltage output levels,
to compare the voltage sample with first and second reference voltages, and
to adjust a voltage provided to the second input of the comparator;
wherein the feedback circuit comprises:
a sampler having an input connected to the output of the comparator and configured to provide,
a first sampling pulse in response to the output of the comparator changing from the first voltage level to the second voltage level and
a second sampling pulse in response to the voltage at the output of the comparator changing from the second voltage level to the first voltage level;

a first amplifier having a first input coupled to the first input of the comparator via a third switch configured to close upon receiving the first sampling pulse from the sampler and a second input coupled to a first reference voltage source;
a second capacitor coupled between the first input of the first amplifier and the common connection;
a second amplifier having a first input coupled to the first input of the comparator via a fourth switch configured to close upon receiving the second sampling pulse from the sampler and a second input coupled to a second reference voltage source;
a third capacitor connected between the first input of the second amplifier and the common connection; and
a fifth switch coupled between the second input of the comparator and outputs of the first and second amplifiers;
wherein the fifth switch is configured to alternately connect the second input of the comparator to the output of the first amplifier and the output of the second amplifier.

13. An oscillator circuit configured to generate an output square wave signal having first and second voltage output levels, the oscillator circuit comprising:
a comparator having an output and first and second inputs;
a switching circuit configured to provide an oscillatory waveform at the first input of the comparator; and
a feedback circuit configured
to sample a voltage on the first input of the comparator in response to the output square wave signal switching between the first and second voltage output levels,
to compare the voltage sample with first and second reference voltages, and
to adjust a voltage provided to the second input of the comparator;
wherein the switching circuit is configured to provide a triangular waveform to the first input of the comparator.

* * * * *